United States Patent
Bass et al.

(10) Patent No.: US 6,449,576 B1
(45) Date of Patent: Sep. 10, 2002

(54) NETWORK PROCESSOR PROBING AND PORT MIRRORING

(75) Inventors: Brian Mitchell Bass, Apex; Jean Louis Calvignac, Cary; Anthony Matteo Gallo, Apex; Marco C. Heddes; Michael Steven Siegel, both of Raleigh, all of NC (US); Fabrice Jean Verplanken, La Gaude (FR); Chad Everett Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/538,247

(22) Filed: Mar. 29, 2000

(51) Int. Cl.[7] .............................................. G01R 27/28
(52) U.S. Cl. ........................ 702/117; 324/751; 324/763; 375/221; 406/152; 714/30; 714/718; 714/726; 714/731; 714/734; 716/4; 716/17
(58) Field of Search ................................. 702/108, 117, 702/118, 120, 124, 126, 183, 185, FOR 103, FOR 104, FOR 134, FOR 135, FOR 170, FOR 171; 324/751; 714/30, 731, 734

(56) References Cited

U.S. PATENT DOCUMENTS

| | | | | |
|---|---|---|---|---|
| 4,216,539 A | * | 8/1980 | Raymond et al. | 714/734 |
| 4,481,627 A | * | 11/1984 | Beauchesne et al. | 714/718 |
| 4,503,386 A | | 3/1985 | DasGupta et al. | 714/731 |
| 4,937,203 A | | 6/1990 | Eichelberger et al. | 406/152 |
| 5,155,432 A | * | 10/1992 | Mahoney | 324/763 |
| 5,253,255 A | | 10/1993 | Carbine | 714/734 |
| 5,526,275 A | | 6/1996 | Enomoto | 716/4 |
| 5,644,496 A | * | 7/1997 | Agrawal et al. | 716/17 |
| 5,838,159 A | | 11/1998 | Johnson | 324/751 |
| 5,867,507 A | * | 2/1999 | Beebe et al. | 714/726 |
| 5,937,154 A | | 8/1999 | Tegethoff | 714/30 |
| 5,956,370 A | * | 9/1999 | Ducaroir et al. | 375/221 |

* cited by examiner

*Primary Examiner*—John S. Hilten
*Assistant Examiner*—John Le
(74) *Attorney, Agent, or Firm*—Matthew W. Baca; Bracewell & Patterson, LLP

(57) ABSTRACT

A method and system for systematically accessing and monitoring operating parameter signals within an IC device. A probe configuration logic selects a subset of signals from among a set of available signals within a physical or logical subdivision of the IC device. Signal access logic selectively provides physical or logical access from the selected subset of signals within the physical or logical subdivision of the IC device to a probe sensor, such that IC device operations may be flexibly and comprehensively monitored. A local mode selector provides remote access to the selected subset of signals at an input/output (I/O) data interface. Data packaging logic in communication with the probe sensor permits port mirroring of the I/O data interface.

17 Claims, 4 Drawing Sheets

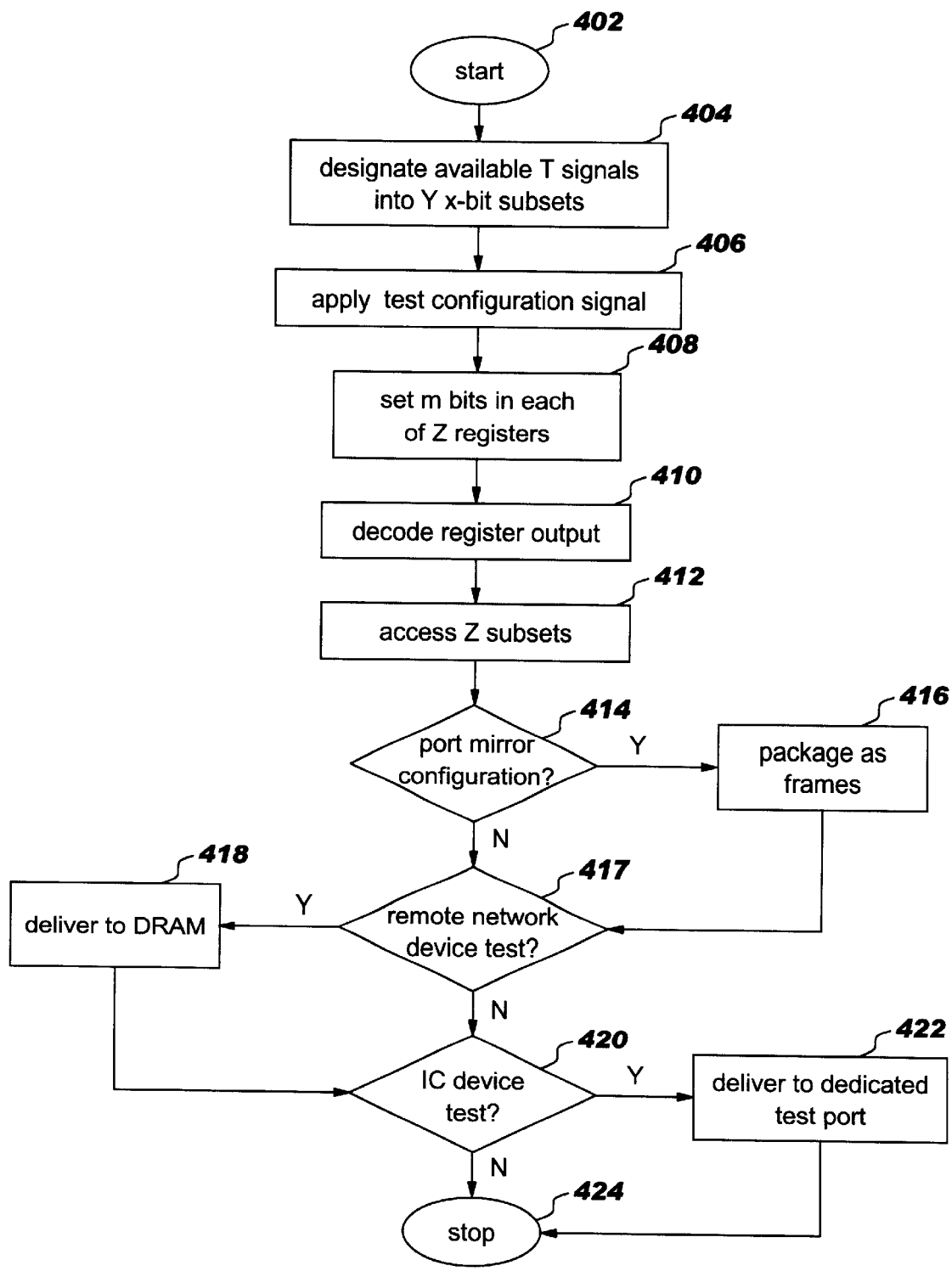

NETWORK PROCESSOR PROBING AND PORT MIRRORING

BACKGROUND OF THE INVENTION

1. Technical Field

The present invention relates in general to testing the operation of integrated circuit (IC) devices, and in particular to systematically analyzing signals within complex IC devices. More particularly, the present invention relates to utilizing an IC probing system for flexibly and comprehensively monitoring intra-system and inter-system signals within telecommunications networks.

2. Description of the Related Art

IC Debugging

Debugging tools have been conventionally required to identify and diagnose faults and to collect useful operating information for complex IC devices. Increasing emphasis is being placed on designing integrated circuit devices to internally incorporate probing logic to reduce the number of I/O pads that must be physically contacted. The rapidly increasing complexity in IC device design has resulted in manufacturing testing techniques which utilize such built-in test logic to analyze several levels of IC performance. Among these levels are wafer level, IC chip module level, multi-chip module (MCM) level, board level, and system level. In the interest of manufacturing efficiency, testing is typically performed at each of the above-mentioned levels in a step-wise manner such that flaws or errors are detected the lowest level possible.

Telecommunications Network Analysis

As Local-Area Networks (LANs) and Wide-Area Networks (WANS) continue to proliferate, and the number of personal computers (PCs) that connect to these networks continue to grow at a rapid pace, the availability of good network management tools becomes ever more important for effective network administration. Network administrators rely heavily on tools that monitor network traffic to ease the task of network management. Network traffic information is particularly useful to network administrators when performing such management tasks as diagnosing problems in the network and performing administrative tasks such as adding, removing or rearranging network devices. As with the aforementioned debugging tools and techniques, network traffic assessment requires the utilization of external overhead fixtures such as RMON sniffers.

It would therefore be useful to provide a probing technique whereby internally implemented probe logic may be flexibly configured to assess the internal operations for an IC device. If implemented, such a method and system would be useful by providing a systematic and comprehensive IC assessment device which also includes inherent network traffic monitoring capabilities.

SUMMARY OF THE INVENTION

A method and system are disclosed for systematically accessing and monitoring operating parameter signals within an IC device. A probe configuration logic selects a subset of signals from among a set of available signals within a physical or logical subdivision of the IC device. Signal access logic selectively provides physical or logical access from the selected subset of signals within said physical or logical subdivision of said IC device to a probe sensor, such that IC device operations may be flexibly and comprehensively monitored. A mode selector provides local means for providing remote access to the selected subset of signals at an input/output (I/O) data interface. Data packaging logic in communication with the probe sensor permits port mirroring of the I/O data interface.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

FIG. 4 is a high-level logic flow diagram depicting steps performed within the probe infrastructure illustrated in FIG. 3 during IC operation monitoring.

DETAILED DESCRIPTION OF THE PREFERRED EMBODIMENT

The method and system of the present invention address the growing need for an efficient means for monitoring the operation of complex (integrated complex) IC devices. For an IC device that is implemented within a telecommunications network, such as a router or network processor, a probe logic apparatus is implemented which provides a context in which the operation of such a device can be analyzed for debugging purposes and for network analysis.

Figure 1:
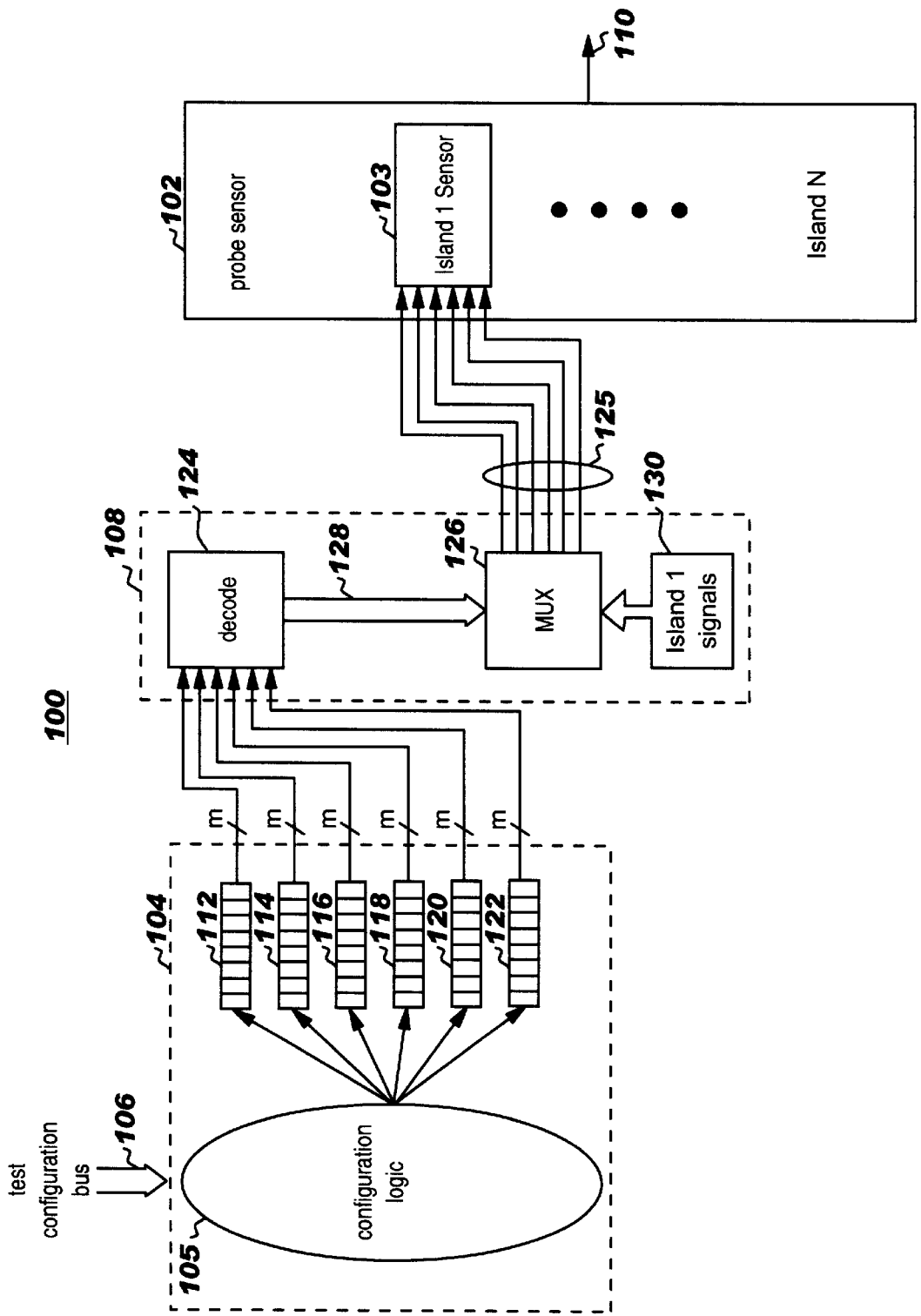
FIG. 1 is a block diagram illustrating a probe infrastructure in accordance with one embodiment of the present invention.

Referring now to the figures, wherein like reference numerals refer to like and corresponding parts throughout, and in particular with reference to. FIG. 1 there is depicted a block diagram illustrating a probe infrastructure 100 in accordance with a preferred embodiment of the present invention. Probe infrastructure 100 includes N test configuration devices, one of which is shown by FIG. 1 as test configuration block 104. Each configuration device corresponds to one of N "islands" within an IC device. As further depicted in FIG. 1, test configuration device 104 receives a test configuration signal from a test configuration bus 106 which includes bus address lines, read/write control lines, and data lines.

As further depicted in FIG. 1, test configuration device 104 includes a test configuration logic block 105 for setting six m-bit test configuration registers 112, 114, 116, 118, 120, and 122 in accordance with the configuration dictated by test configuration bus 106. It should be noted that although configuration device 104 is illustrated in the present example as having six configuration registers, the inventive concept described herein is not limited to this particular number.

Test configuration device 104 is utilized to select a subset of signals from within a physical or logical subdivision of an IC device in which probe infrastructure 100 is incorporated. As utilized herein, a "physical or logical subset" of an IC device, refers to a physically or logically discrete entity or function implemented within the IC device. Examples of such subdivisions include any of the following either individually or in any combination: input/output (I/O) interface module, an Arithmetic Logic Unit (ALU), a collection of DRAM cells, a latch, etc. Since the choice of any particular IC subdivision is not a limiting factor for the scope of the present invention, and in the interest of simplicity of explanation of the present invention, "island" will be utilized hereinafter in place of "physical or logical subdivision".

The IC device in which probe infrastructure 100 is implemented includes N such islands from which signals may be selected and accessed for testing or other purposes. The signals available for testing within an island may include state machine values, internal signals, counters, request/acknowledge interfaces, or any other signal that would be useful in determining how the island is operating. A total number, T, of such signals are available within each island for selection and access by probe infrastructure 100. Within test configuration block 104, configuration logic block 105 selects Z subsets (Z=six in the depicted example) from among Y=T/x available signal subsets, wherein x is equal to the number of signals within each signal subset.

In accordance with the method and system of the present invention, the configuration dictated by test configuration bus 106 conveys a desired test configuration according to at least two factors. One of the two factors is the nature of the designation of subsets insofar as it determines which signals are simultaneously monitored (in accordance with the makeup of the individual subsets). In this manner, test configuration bus 106 is limited by the combinations and permutations of signals which can be monitored in a given probe cycle as determined by the pre-designated subsets of signals illustrated within block 130. The second factor guiding the nature of configuration signal 106 is the desired overall test configuration as determined by the user.

Figure 3:
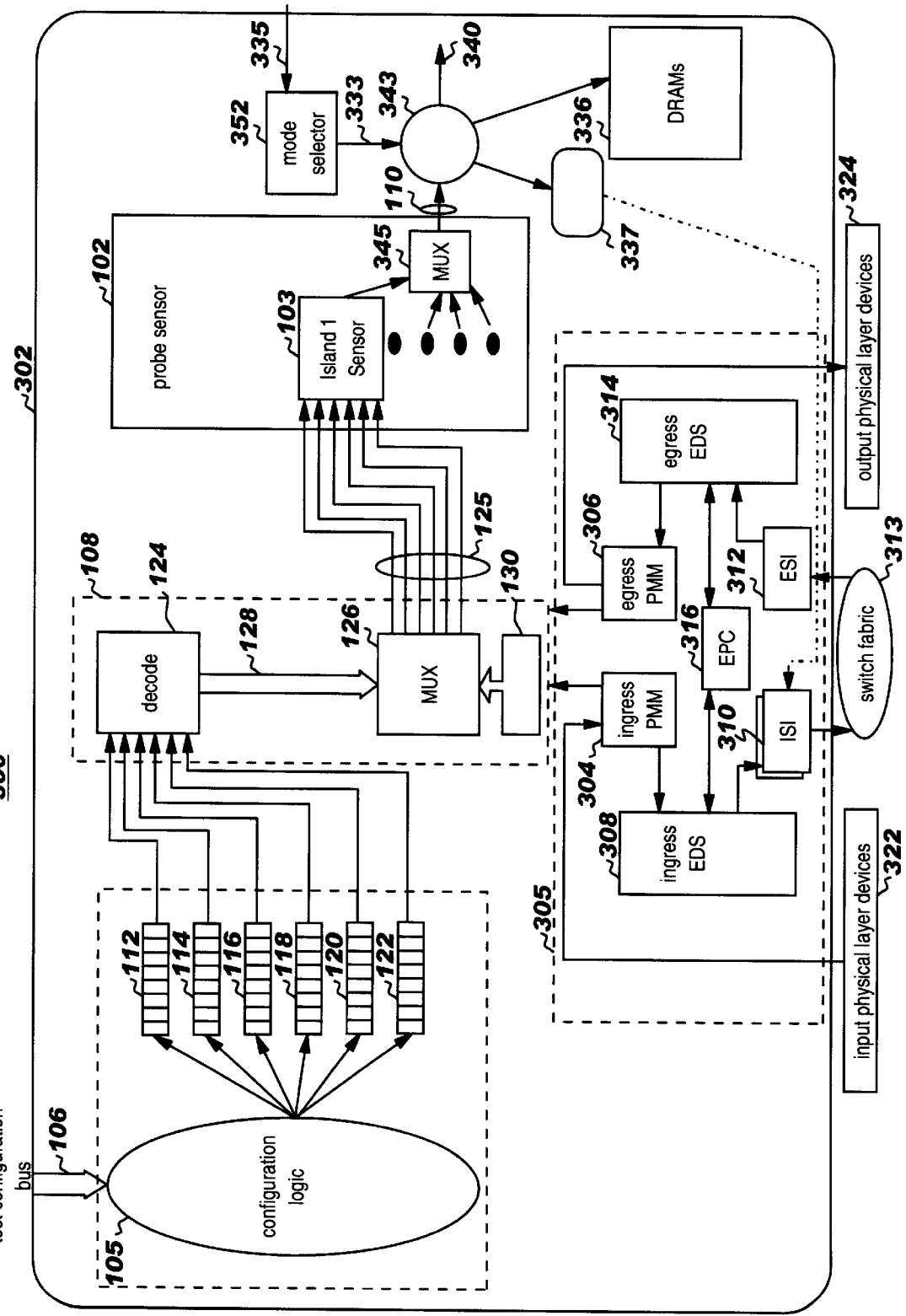
FIG. 3 is a block diagram illustrating utilization of the probe infrastructure of FIG. 1 as a network analysis tool.

The total number of test signals selected by configuration logic block 105 is therefore equal to the number of configuration registers (six in the present example) multiplied by the number of signals, x, within each selected subset. If x is set to four, probe infrastructure 100 may select six subsets of four signals and thus access up to 24 signals per island and 24×N total signals from all N islands. It should be noted that a feature of the inventive embodiment depicted in FIG. 1 is the flexibility by which the configuration registers may be set. This feature is made possible by the fact that each of configuration registers 112, 114, 116, 118, 120, and 122 comprise m bits and thus may be set by test configuration logic block 105 to select from among $2^m$ different signal subsets. For example, if m=seven, the test configuration blocks for each island may select from among Y=127 x-bit subsets from among a total of T signals in any possible combination. The signal subset selection performed by probe infrastructure 100 may be further narrowed by an additional selection system implemented as depicted in FIG. 3.

As further illustrated in FIG. 1, probe infrastructure 100 further comprises a signal access device 108 for accessing only the signals within the subsets selected by test configuration device 104. In accordance with the inventive embodiment depicted in FIG. 1, signal access device 108 provides a context in which available island signals 130 are accessible for testing. Such selective accessibility is provided within signal access device 108 by decoding logic block 124 which decodes each m-bit output from configuration registers 112, 114, 116, 118, 120, and 122. Select lines 128 deliver Z=six x-bit signal subset selections from decoding logic block 124 to a multiplexing logic block 126 wherein the selections coded within test configuration device 104 and decoded within decoding logic block 124 are utilized to physically or logically access the 6x selected signals (six x-bit signal sets).

The subset comprising six x-bit sets that is selected within test configuration device 104 and accessed within signal access device 108 is delivered to a probe sensor block 102. Probe sensor block 102 includes logic for receiving and processing signals from signal access device 108.

Figure 2:
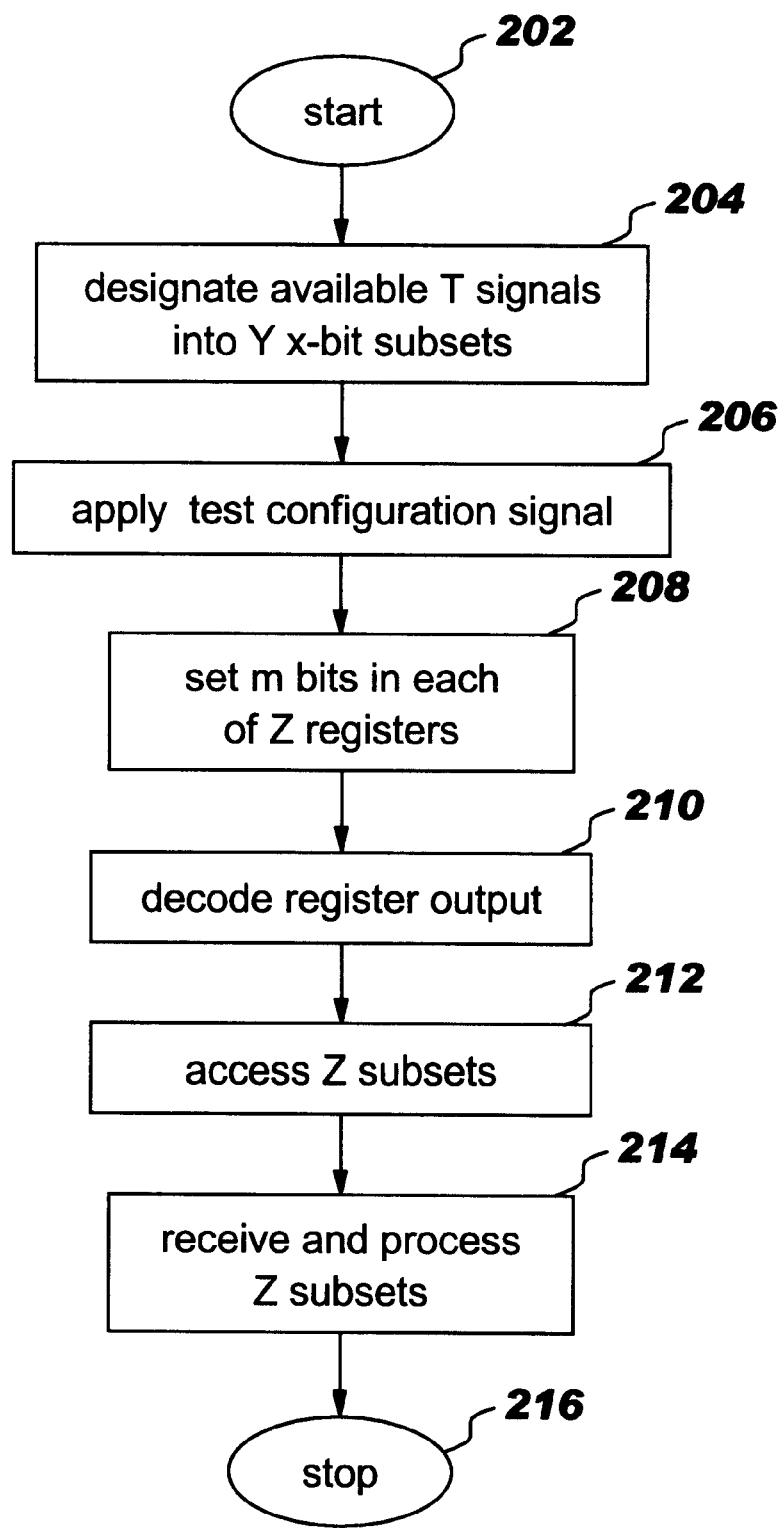
FIG. 2 is a high-level flow diagram depicting steps performed during IC operation monitoring within the probe infrastructure illustrated in FIG. 1.

Turning now to FIG. 2, there is illustrated a high-level flow diagram depicting steps performed during IC operation monitoring within probe infrastructure 100. The monitoring processing commences as depicted at step 202 and proceeds to step 204 which illustrates the designation of the Z x-bit subsets from signals within an island which are available for monitoring. In the embodiment depicted in FIG. 2, the total number of available signals, T, is greater than or equal to one. In accordance with predetermined design or testing requirements, these T signals are divided into Y subsets wherein each subset includes x signals. The present embodiment utilizes a single uniform number, x, as the number of signals within each subset. It should be noted, however, alternate embodiments of the present invention may be practiced wherein the number of signals within each designated subset varies.

Proceeding to step 206, there is shown an application of a test configuration signal from test configuration bus 106, which, as illustrated at step 208, results in the setting of m bits in each of Z=6 configuration registers 112, 114, 116, 118, 120, and 122 within test configuration device 104. The setting of each of the Z registers identifies a particular x-bit signal subset (a subset comprising x signals) that has been selected in accordance with the configuration signal applied at step 206 to be monitored by the probe apparatus of the present invention. In the embodiment depicted in FIG. 2, the number of subsets selected by test configuration bus 106 is limited to the number of configuration registers, Z.

The settings of the six configuration registers 112, 114, 116, 118, 120, and 122 are decoded as depicted at step 210. An m-bit decoding device comprising decoding logic block 124 is utilized to identify the six x-bit signal subsets selected by test configuration bus 106 as applied at step 206. In accordance with the method and system of the present invention, the number of bits, m, within each configuration register is determined as follows:

$$T/x \leq 2^m,$$

wherein T is the number of available signals within an island and x is the number of signals with each subset.

The monitoring process depicted in FIG. 2 proceeds as shown at step 212 with the six decoded x-bit subsets being physically or logically accessed utilizing multiplexing logic block 126. It should be noted that in accordance with an important feature of the probe apparatus of the present invention, the need for external probing devices is minimized. Probe infrastructure 100 includes means for performing the signal access depicted at step 212 internally within the monitored IC: device. Signal access device 108 resides within the IC device being monitored, thus providing a platform by which multiplexing means 126 may selectively access the selected Z subsets designated from the Y total signal subsets at step 204. The signal monitoring process of the present embodiment concludes as illustrated at steps 214 and 216 with Z x-bit signal subsets that have been systematically selected and accessed as shown at steps 204 through 212, being received and processed within probe sensor logic.

The probing system and method depicted in FIGS. 1 and 2 provide a systematic and flexible technique whereby internal signals within a complex IC device such as a microprocessor may be selectively accessed in a strategically determined test configuration. Such IC devices may include network processing devices utilized to bridge, route, or otherwise process telecommunications network traffic. In an alternate embodiment of the present invention described in further detail with reference to FIGS. 3 and 4, a test mode selector is utilized in conjunction with the probe infrastructure described in FIGS. 1 and 2 to implement a novel port mirror infrastructure within a network IC device.

Port mirroring is a network analysis tool that allows a network manager to efficiently determine the location of a network problem. Implementation of port mirroring includes assigning a "source port" from or to which all outgoing or incoming traffic will be copied. A "mirror port" is then designated as the port to which all the copied frames will be delivered for analysis. Port mirroring commences when all traffic (in the form of data units such as Ethernet frames or ATM cells) from the source port are copied and sent to the designated mirror port which provides a centralized location at which a data analysis tool such as an RMON sniffer may be attached. Multicasting is a known method by which data units such as Ethernet frames may be copied and delivered to multiple destination ports.

By centralizing the location at which network traffic is analyzed, port mirroring is more efficient than manually probing selected ports over a physically and geographically dispersed network. However, conventional port mirroring techniques require additional processing overhead needed for multicasting and other frame duplication techniques. The method and system of the present invention, as illustrated in the alternate embodiment depicted in FIGS. 3 and 4, provides additional test mode selection means such that probe data can be utilized as port mirroring data for network management use.

With reference now to FIG. 3 there is depicted a high-level block diagram illustrating utilization of the probe infrastructure of FIG. 1 as a network analysis tool in addition to a chip debug tool. As shown in FIG. 3, a test infrastructure 300 includes an IC network device 302 that may be a hub, a bridge, a router, a network processor, or any other telecommunications network device into and/or out of which network traffic flows. It should be noted that the embodiment depicted in FIG. 3 includes several of the features illustrated with reference to FIG. 1, and that such shared features are numbered alike. As in probe infrastructure 100, test infrastructure 300 includes test configuration device 104 that selects six x-bit subsets from a total of T signals within an island which have been previously divided into a total of Y selectable subsets 130. Test infrastructure 300 further includes signal access device 108 for providing physical or logical access from a probe sensor 102 to selected subsets 125.

In accordance with the embodiment depicted in FIG. 3, probe sensor 102 includes island 1 sensor 103 that receives selected subsets 125 as inputs. Island 1 sensor 103 receives and delivers the signal subsets within island 1 that were selected in accordance with the test configuration signal within test configuration bus 106.

In the depicted embodiment, the number of subsets selected from island 1 may range from none to six, as designated by registers 112, 114, 116, 118, 120, and 122. It should be noted that sensors for additional islands may also be present within probe sensor 102 identical in construction and operation as island 1 sensor 103. The selected signal subsets from each of the islands (signals 125 for island 1) are delivered to a multiplexor 345 which selects a final test set 343 from among the subsets from each island.

A mode select signal 333 from a mode selector 332 selects one or more of three possible sensing modes for probe sensor 102, including a test mode, a runtime operations mode, and a port mirror mode. In the embodiment depicted in FIG. 3, mode selector 332 translates a mode input signal 335 into mode select signal 333 which is then utilized to characterize and direct the output of probe sensor 102 to a test I/O 340, a DRAM module 336, or a network I/O interface 305 in accordance with which one or more of the modes are selected. The source from which mode input signal 335 originates may be from within probe infrastructure 300, or it may be externally generated (a manual user input, for example).

As further illustrated in FIG. 3, IC network device 302 communicates to and from other network devices via network I/O interface 305 which maintains network communication with external device interfaces 322 and 324. IC network device 302 comprises an embedded processor complex (EPC) 316 in communication with an ingress enqueue/dequeue/scheduler (EDS) 308 and an egress EDS 314. EPC 316 includes protocol processors, a 3-stage pipeline (fetch, decode, and execute), general purpose registers, special purpose registers, cache memory, Arithmetic Logic Unit (ALU), and hardware assist coprocessors.

Ingress EDS 308 provides all the necessary internal queues on the "ingress", or "Up-Side" of IC network device 302 to allow several media ports to receive frames or cells simultaneously. The data within these frame or cells is temporarily stored in an ingress data storage device within ingress EDS 308 while the data packet header information is processed within EPC 316. When EPC 316 has determined the destination of the packet, the packet is enqueued to target network processor queues for delivery to a switch fabric 313. Ingress EDS 308 performs queue management and interacts with an ingress switch interface 310 to segment frames into switch cells. Such frame are "cut-through" on the ingress side of IC network device 302, meaning the beginning of the frame can be sent to the switch fabric before the end of the frame has been received at ingress EDS 308.

In the depicted example, IC network device 302 further includes an ingress physical MAC multiplexer (PMM) 304 and an egress PMM 306, each of which integrate at least one media interface macro. Each of the media interface macros comprising ingress PMM 304 and egress PMM 306 can be individually configured to support different Ethernet traffic including 100 Mbps Ethernet ports, Gigabit Ethernet ports, Packet-Over-SONET (POS) ports, etc. The media interface macros are not required to be programmed to accommodate the same mode which allows combinations of Ethernet, Fast Ethernet, Gigabit Ethernet, and POS ports to reside together within IC network device 302. Ingress PMM 304 receives incoming network traffic in the form of Ethernet frames and ATM cells from external device interface 322. Egress PMM 306 transmits the processed frames and cells to external device interface 324.

In accordance with the embodiment depicted in FIG. 3, probe sensor 102 includes a data packaging logic block 337. In response to a "test mode" request from mode selector 332, final test set 343 is delivered to data packaging logic block 337 wherein the data within selected subset 125 is packaged into data packets and delivered to input switch interface 310 from which it is sent across switch fabric 313. In this manner port mirror infrastructure may be utilized to monitor data traffic into or out of network I/O interface 305. In response to a indication from mode input signal 335 that network device in undergoing normal runtime operations (without port mirroring), probe infrastructure 300 stores the data gathered within probe sensor 102 within DRAM module 336. During debugging or "lab bringup" of the IC device within which probe infrastructure 300 is incorporated, mode selector will direct island 1 sensor (and other island sensors) to deliver its data output to a dedicated test I/O port 340.

FIG. 4 is a high-level logic diagram depicting steps performed within the probe infrastructure 300 during IC operation monitoring. Steps 402 through 412 are performed as explained with reference to steps 202 through 212 of FIG. 2. Next, inquiry steps 414, 417, and 420 depict a three-part determination of which of three possible modes have been selected by mode selector 332, such that final test signals 343 can be delivered accordingly. In particular, step 414 illustrates a determination of whether probe sensor 102 is in port mirror mode as determined within mode selector 332. If so, and as shown at step 416 the data selected from the island sensors including island 1 sensor 103, is packaged as frames within data packaging logic block 337. These frames may then be utilized as port mirror data as described with reference to FIG. 3.

Regardless of the determination at step 414, the process proceeds to step 417 which depicts a determination of whether final test signal set 343 are relevant to a remote network device such as a downstream packet switch. If so, final test set 343 is delivered to an external DRAM 336 for storage and later utilization (step 418). Proceeding to step 420, if mode selector 332 selects a chip "test mode", the data received at the island sensors is delivered to dedicated test I/O port 340 (step 422).

It is important to note that, while the present invention has been, and will continue to be, described in the context of telecommunications networking infrastructure, those skilled in the art will appreciate that the present invention is capable of being implemented as a program product in a variety of forms, and that the present invention applies equally regardless of the particular type of signal-bearing media utilized to actually carry out the implementation. Examples of signal-bearing media include: recordable-type media, such as floppy disks, hard disk drives, and CD ROMs, and transmission-type media such as digital and analog communication links.

Preferred implementations of the invention include implementations as a computer system programmed to execute the method or methods described with reference to FIGS. 2 and 4, and as a program product. According to the computer system implementation, sets of instructions for executing the method and methods are resident in RAM of one or more computer systems configured generally as described above. Until required by the computer system, the set of instructions may be stored as a computer-program product in another computer memory, for example, in a disk drive (which may include a removable memory such as an optical disk or floppy disk for eventual utilization in disk drive).

While the invention has been particularly shown as described with reference to a preferred embodiment, it will be understood by those skilled in the art that various changes in form and detail may be made therein without departing from the spirit and scope of the invention. It is therefore contemplated that such modifications can be made without departing from the spirit or scope of the present invention as defined in the appended claims.

What is claimed is:

1. A method for analyzing operating parameters within an integrated circuit (IC), said method comprising the steps of:

selecting Z signal subsets from among a set of signals available within a physical or logical subdivision of said IC, wherein Z is a number greater than or equal to one, wherein said selecting includes:

inputting a test configuration signal; and setting m bits within each of Z m-bit registers in accordance with said input configuration signal, wherein m is determined in accordance with the relation:

$$T=2^m,$$

wherein T represents the total number of available signals within said physical or logical subdivision of said IC device;

accessing only said selected Z signal subsets within said physical or logical subdivision in response to said selecting step; and delivering said Z signal subsets to an input/output (I/O) data port, such that said IC operating parameters may be utilized for local or remote telecommunications network analysis.

2. The method of claim 1, wherein said accessing step comprises the steps of:

physically or logically accessing said set of available signals;

identifying said Z selected signal subsets from among said set of available signals; and physically or logically connecting said Z selected signal subsets to a sensor.

3. The method of claim 2, wherein said IC device is incorporated within a network processing device having an I/O data interface which receives or delivers network data packets and a switch for switching the data packets within said network processor, wherein switch connects said data I/O port to said I/O data interface, and wherein said delivering step comprises the step of delivering said Z selected signal subsets from said I/O data port to said I/O data interface.

4. The method of claim 3, wherein said sensor includes data packaging logic, and wherein said method further comprises the steps of:

receiving said Z selected signal subsets at said sensor;

packaging said Z selected signal subsets into data packets in response to said receiving step; and delivering said data packets to said switch, such that the selected signal subsets may be utilized to monitor data traffic at the I/O data interface.

5. The method of claim 1, wherein said accessing step comprises the steps of:

decoding each m-bit output from said Z, m-bit registers; and selecting Z, x-bit signal subsets in response to said decoding step.

6. A monitoring infrastructure for systematically providing local and remote access to signals within an integrated circuit (IC) device comprising:

a test configuration logic device for selecting Z, x-bit signal subsets from among a set of T available signals within a physical or logical subdivision of said IC device, wherein x, Z, and T are numbers greater than or equal to one, wherein said test configuration logic device includes:

Z m-bit registers for selecting Z, x-bit signal subsets, wherein m is determined in accordance with the relation:

$$T=2^m,$$

wherein T represents the total number of available signals within said physical or logical subdivision of said IC device;

a signal access logic device for accessing only the selected signal subsets within said physical or logical subdivision of said IC device, such that IC device operations may be flexibly and comprehensively monitored; and a mode selector for delivering said selected signal subsets for inter-system, and intra-system analysis.

7. The monitoring infrastructure of claim 6, further comprising a probe sensor that receives and processes the selected subset of signals from said signal access logic device.

8. The monitoring infrastructure of claim 7, wherein said IC device is a physical or logical subdivision of a network processing device having an input/output (I/O) data interface and a switch for switching data packets within said network processor, and wherein said mode selector routes said selected signal subsets in accordance with a test mode input signal.

9. The monitoring infrastructure of claim 8, further comprises data packaging logic in communication with said mode selector, such that the signals received by said probe sensor may be delivered across said switch as data packets, such that said monitoring infrastructure may be utilized to monitor data traffic at said I/O data interface.

10. The monitoring infrastructure of claim 6, wherein said signal access logic device comprises control select lines for physically or logically accessing said set of available signal within said physical or logical subdivision of said IC device.

11. The monitoring infrastructure of claim 6, wherein said test configuration logic device further comprises:

a test configuration bus; and test configuration logic for setting the m bits within each of said Z registers in accordance with a test configuration signal delivered by said test configuration bus.

12. The monitoring infrastructure of claim 6, wherein said signal access logic comprises:

decoding logic for decoding each m-bit output from said Z m-bit registers; and multiplexing logic for selecting said Z, x-bit signal subsets in accordance with the output of said decoding logic.

13. A program product for analyzing operating parameters within an integrated circuit (IC), said program product comprising:

program instruction means for selecting Z signal subsets from among a set of signals available within a physical or logical subdivision of said IC, wherein Z is a number greater than or equal to one, including:

program instruction means for inputting a test configuration signal; and program instruction means for setting m bits within each of Z m-bit registers in accordance with said input configuration signal, wherein m is determined in accordance with the relation:

$T=2^m$, wherein T represents the total number of available signals within said physical or logical subdivision of said IC device;

program instruction means for accessing only said selected Z signal subsets within said physical or logical subdivision in response to said selecting step; and program instruction means for delivering said Z signal subsets to an input/output (I/O) data port, such that said IC operating parameters may be utilized for local or remote telecommunications network analysis.

14. The program product of claim 13, wherein said program instruction means for accessing only said selected Z signal subsets within said physical or logical subdivision comprises:

program instruction means for physically or logically accessing said set of available signals;

program instruction means for identifying said Z selected signal subsets from among said set of available signals; and program instruction means for physically or logically connecting said Z selected signal subsets to a sensor.

15. The program product of claim 14, wherein said IC device is incorporated within a network processing device having an I/O data interface which receives or delivers network data packets and a switch for switching the data packets within said network processor, wherein switch connects said data I/O port to said I/O data interface, and wherein said program instruction means for delivering said Z signal subsets to an input/output (I/O) data port comprises program instruction means for delivering said Z selected signal subsets from said I/O data port to said I/O data interface.

16. The program product of claim 15, wherein said sensor includes data packaging logic, and wherein said program product further comprises:

program instruction means for receiving said Z selected signal subsets at said sensor;

program instruction means for packaging said Z selected signal subsets into data packets in response to said receiving step; and program instruction means for delivering said data packets to said switch, such that the selected signal subsets may be utilized to monitor data traffic at the I/O data interface.

17. The program product of claim 13, wherein said program instruction means for accessing only said selected Z signal subsets within said physical or logical subdivision step comprises:

program instruction means for decoding each m-bit output from said Z, m-bit registers;

program instruction means for selecting Z, x-bit signal subsets in response to said decoding step.

* * * * *